(12) United States Patent
Agarwal et al.

(10) Patent No.: US 10,418,975 B2
(45) Date of Patent: Sep. 17, 2019

(54) LOW CLOCK SUPPLY VOLTAGE INTERRUPTIBLE SEQUENTIAL

(71) Applicant: Intel Corporation, Santa Clara, CA (US)

(72) Inventors: Amit Agarwal, Hillsboro, OR (US); Steven K. Hsu, Lake Oswego, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 15/260,180

(22) Filed: Sep. 8, 2016

(65) Prior Publication Data

US 2018/0069538 A1 Mar. 8, 2018

(51) Int. Cl.
| | |
|---|---|
| *H03K 3/356* | (2006.01) |
| *H03K 19/01* | (2006.01) |
| *H03K 3/00* | (2006.01) |
| *H02H 11/00* | (2006.01) |
| *H05B 39/00* | (2006.01) |
| *G11C 7/12* | (2006.01) |
| *H03K 3/012* | (2006.01) |
| *H03K 3/3562* | (2006.01) |

(52) U.S. Cl.
CPC ......... *H03K 3/012* (2013.01); *H03K 3/35625* (2013.01)

(58) Field of Classification Search
CPC .......................... H03K 3/012; H03K 3/35625

USPC ........ 327/115, 116, 117, 118, 199, 355–360, 327/202, 203, 208–215, 218
See application file for complete search history.

(56) References Cited

U.S. PATENT DOCUMENTS

| | | | | |
|---|---|---|---|---|
| 5,900,760 | A * | 5/1999 | Lee ...................... | H03K 3/2885 327/202 |
| 7,132,856 | B2 * | 11/2006 | Hsu .................. | H03K 3/356156 326/81 |
| 7,265,599 | B1 * | 9/2007 | Pasqualini ............. | H03K 3/013 327/202 |
| 2003/0117933 | A1 * | 6/2003 | Hsu ........................ | H03K 3/012 369/200 |
| 2006/0044013 | A1 * | 3/2006 | Hsu .................. | H03K 3/356156 326/81 |
| 2008/0054942 | A1 | 3/2008 | Drapkin et al. | |

(Continued)

OTHER PUBLICATIONS

International Search Report and Written Opinion for International Patent Application No. PCT/US2017/041872, dated Nov. 2, 2017.

(Continued)

*Primary Examiner* — Brandon S Cole

(74) *Attorney, Agent, or Firm* — Green, Howard & Mughal LLP

(57) ABSTRACT

An apparatus is provided which comprises a clock inverter having an input coupled to a clock node, the clock inverter having an output, wherein the clock inverter has an N-well which is coupled to a first power supply; and a plurality of sequential logics coupled to the output of the clock inverter and also coupled to the clock node, wherein at least one sequential logics of the plurality of the sequential logics has an N-well which is coupled to a second power supply, wherein the second power supply has a voltage level lower than a voltage level of the first power supply.

14 Claims, 8 Drawing Sheets

(56) References Cited

U.S. PATENT DOCUMENTS

| | | |
|---|---|---|
| 2009/0168557 A1 | 7/2009 | Agarwal et al. |
| 2011/0058635 A1 | 3/2011 | Ko et al. |
| 2014/0225657 A1 | 8/2014 | Toshiba K |
| 2015/0249442 A1* | 9/2015 | Hsu .................. H03K 3/356104 327/211 |
| 2016/0322962 A1* | 11/2016 | Hsu .................. H03K 3/356104 |

OTHER PUBLICATIONS

International Preliminary Report on Patentability dated Mar. 21, 2019 for PCT Patent Application No. PCT/US2017/41872.

* cited by examiner

LOW CLOCK SUPPLY VOLTAGE INTERRUPTIBLE SEQUENTIAL

BACKGROUND

Area-efficient designs for modern microprocessors, DSP's (Digital Signal Processors), SoC's (System-on-Chip) in wearables, IoTs (Internet-of-Things), smartphones, tablets, laptops, and servers, etc., are increasingly becoming a critical factor due to the following requirements: reducing silicon cost, decreasing PCB (Printed Circuit Board) footprint, improving time-to-market (TTM), and slower scaling cadence of process technology node. These requirements all need to be met while meeting the stringent frequency and/or performance targets and power/leakage budgets.

A major component of the power dissipation in digital systems is due to charging and discharging load capacitance of circuit nodes, otherwise known as dynamic power. In today's clocked synchronous systems—microprocessors, DSP's, and SoC's in smartphones, tablets, laptops, and servers, a large percentage of the overall power dissipation (e.g., greater than 30%) is in the clock grid and final sequential load.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
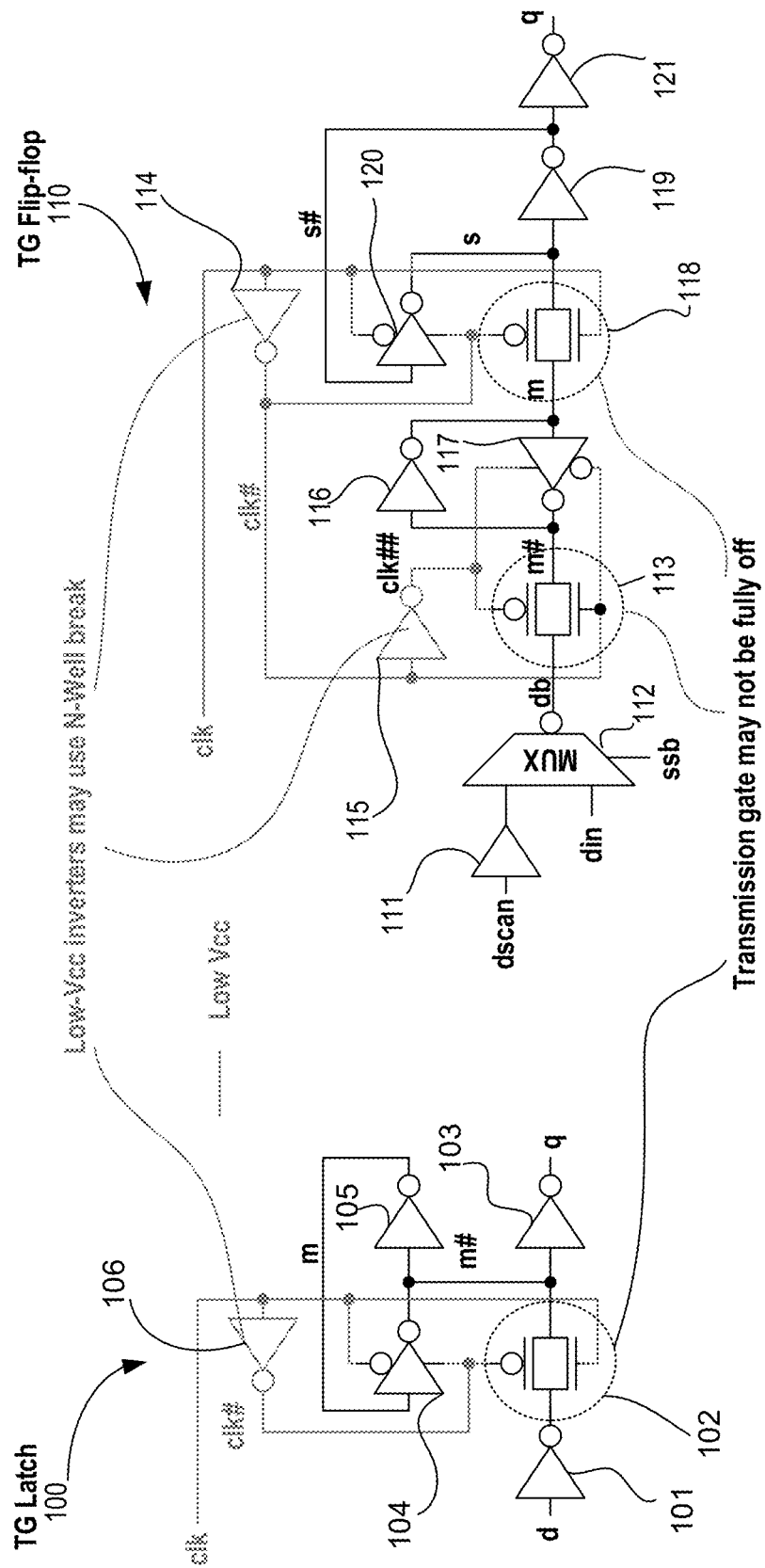
FIG. 1 illustrates a transmission gate protected input latch and master-slave flip-flop (FF).

In clocked synchronous systems, a large percentage of the overall power dissipation is in the clock tree grid and final sequential load. Designing sequential units for low power consumption improve power efficiency of these clocked synchronous systems. Another knob to reduce power and improve power efficiency in such a system is to lower the supply voltage and scale down frequency. Voltage scaling of a chip may be constrained by the lowest operating voltage ($V_{MIN}$) under process variation. Here, the term "$V_{MIN}$" generally refers to the lowest operating supply voltage below which the sequential or memory may lose its stored data. The term "$V_{MIN}$" may also refer to the lowest operating supply voltage below which the sequential or memory may not reflect correct data because of retention, setup, or hold failures. One of the limiters of $V_{MIN}$ is the sequential hold time degradation at lower voltages resulting in frequency independent functional failures. Since the majority of sequential units have a very low data activity (e.g., 5% to 10%), clock power dominates the overall sequential dynamic power.

A large percentage of logic paths in a system may have timing slack or are non-critical. Here, non-critical timing paths generally refer to data paths that have setup and/or hold margins when the processor having such paths is operating at its fastest frequency. Such paths are not the bottleneck for the processor to achieve its highest frequency. Since delay may not be the primary concern, these non-critical paths typically use sequential units with minimum sized transistors to reduce power. These minimum sized sequential units are a common power lever used in many microprocessor and SoC products. These sequential units cannot be downsized any further to take advantage of the timing slack because the sizing of the sequential units depends on the minimum sized transistors allowed by the process technology and that a minimum transistor width is needed to meet the product's $V_{MIN}$ requirements.

One way to reduce clock power contribution is to operate the clock path at lower supply voltages while keeping the data-path at high supply to preserve performance, according to some embodiments of the disclosure. To get the maximum benefit of reducing both clock grid power and sequential clock load power, the clock is operated at lower supply all the way to the sequential. The lower the supply voltage is of the clock path compared to data-path, the more the power savings. Hence the lowering of the clock supply at which these sequential logics are functional across PVT (Power, Voltage, and Temperature) variation may achieve maximum power savings.

Any delay loss due to these low power supply clock sequential logics can be compensated by small increase in data-path supply which comes at the cost of power increase. Hence, reducing these sequential delay overhead may achieve net power gain. Operating clock path and data path on different supply levels may cause a DC (direct current) short circuit current. In some cases, the tradeoff between increase in DC power consumption and the decrease in dynamic or switching power consumption, from operating clock path on lower power supply than the data path, is clearly in favor of using separate power supplies for the clock path and the data path. For example, the savings in dynamic power outweighs the cost of DC short circuit current.

Various embodiments describe a low clock supply voltage interruptible sequential logic (e.g., latch and/or flip-flip (FF)). In some embodiments, these sequential logics do not have DC short circuit current and are partially interrupted, and as such, improve the lowest operational clock supply voltage for maximum power savings and minimum delay overhead. Various embodiments describe a family of low clock supply voltage and high supply data-path latches/flip-flops to reduce full chip clock power. A partial interruptible design with reduced contention in the circuit and static CMOS (Complementary Metal Oxide Semiconductor) implementation enables robust low clock supply voltage operation and minimum delay overhead.

In various embodiments, a clock controlled n-type pass-gate based latch/flip-flop is used which does not suffer from data race/flipping which would be seen in a clock controlled transmission gate (TG). Note, a TG is formed by a parallel coupling of an n-type device and a p-type device. When the clock path has a lower power supply, the p-type device of the TG may not be fully off (e.g., it is partially on) which may cause data race/flipping.

In some embodiments, a local clock inverter is used inside the flip-flop and this local clock inverter is connected to a low-supply voltage to prevent DC short circuit current. In some embodiments, the local clock inverter is shared across multiple flip-flops in a vector design reducing any N-well break area overhead. In some embodiments, the low supply local clock inverter N-well is tied to a high power supply to remove N-well area overhead. In some embodiments, a clock controlled p-type device (or transistor) is inserted between cross-coupled inverters of a latch resulting in partial interruption. As such, contention during latch write is reduced. In some embodiments, data controlled p-type devices are inserted in the latch that help in completing the writing '1' to the state nodes of the FF or latch. This reduced contention and write '1' help results in lower clock supply voltage under PVT variations with low delay impact. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term s "left," "right," "front," "back," "top," "bottom," "over," "under," the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a TG protected input latch 100 and master-slave flip-flop (FF) 110. TG protected input latch 100 comprises of data node 'd', clock node "clk", output node 'q', internal nodes "clk#", 'm', and "m#", inverter 101, TG 102, inverter 103, tristate-able inverter 104, inverter 105, and clock inverter 106 coupled together as shown. Throughout the disclosure, references to node names and signal names are interchangeably used. For example, "clk" may refer to clock node "clk" or clock signal "clk" on that node depending on the context of the sentence.

TG protected FF 110 comprises data scan input node "dscan", data input node "din", scan multiplexer control node "ssb", clock node "clk", output node 'q', internal nodes "clk#", "clk##", "db", "m#", 's', "s#", data scan buffer 111, scan multiplexer (MUX) 112, first TG 113, first clock inverter 114, second clock inverter 115, master latch inverter 116, master latch tristate-able inverter 117, second TG 118, slave latch inverter 119, slave latch tristate-able inverter 120, and output inverter 121 coupled together as shown.

In one example, when the clock input "clk" of TG latch/flip-flop 100/110 is provided using a low power supply while the other gates of TG latch/flip-flop 100/110 are controlled by a high power supply, there may be a DC short circuit current in the local clock inverters (e.g., the p-devices of inverters 106 and 114 may not be fully off). To prevent this DC short circuit current, the internal local clock inverters of these TG latch/flip-flop 100/110 can be operated at low clock supply (e.g., the same supply level which generates the "clk" signal).

In some embodiments, clock inverter 106 of TG latch 100 operates on a lower power supply than the rest of the transistors (and/or logics) of TG latch 100. In some embodiments, first and second clock inverters 114 and 115, respectively, of TG FF 110 operate on a lower power supply than the rest of the transistors (and/or logics) of TG FF 110. The gray shaded clock path (as opposed to darker shaded data path) represents a path operating on a lower power supply than the data path. In N-well based process technologies (e.g., where p-type devices are formed in an N-well), the N-well(s) of all transistors of that process technology is coupled to a single power supply. This power supply is generally the operating voltage of the chip having TG latch/flip-flop 100/110. A person skilled in the art would appreciate that the substrate or body of a p-type transistor is generally coupled to the operating power supply to reduce subthreshold leakage and threshold voltage shift.

In some embodiments, to lower the power supply consumption of latches and flip-flops, the clock path is operated on a lower power supply than the data path. As such, the N-wells of the clock path are coupled to a different power supply than the N-wells of the rest of the latch or flip-flops. This separation of N-wells may require an N-well break between a low supply N-well and a high supply N-well, resulting in area overhead. Moreover, operating or controlling TGs 102, 113, and 118 using lower power supply based clock signals (e.g., "clk", "clk#", and "clk##") in these TG latch/flip-flop 100/110 may cause TGs 102, 113, and 118 to be partially on while keepers are holding the data, resulting in data race/flipping.

Figure 2:
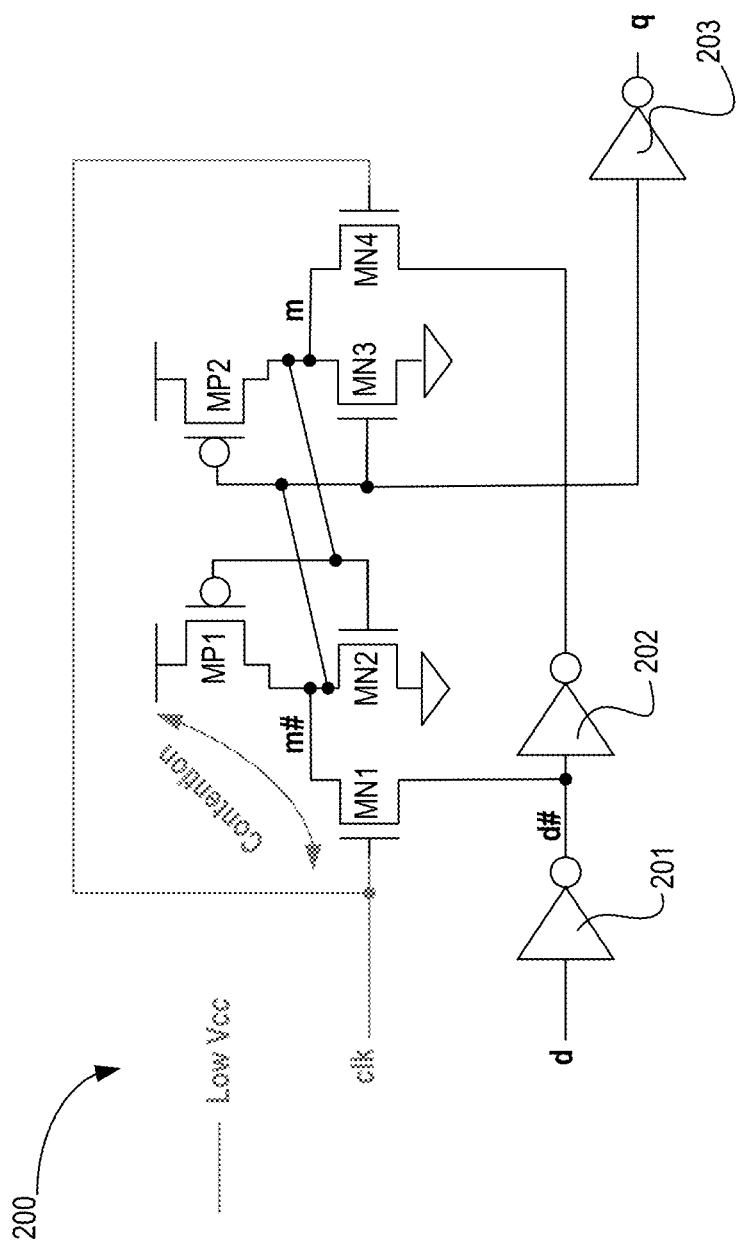
FIG. 2 illustrates a register file high-phase latch.

FIG. 2 illustrates a register file (RF) high-phase latch 200. Latch 200 comprises a clock node "clk", a data node 'd', output node 'q', internal nodes "d#", "m#" inverters 201, 202, and 203, access devices MN1 and MN4, and cross-coupled inverters having devices (or transistors) MP1, MN2, MP2, and MN3 coupled together as shown. The gray shaded clock path (as opposed to darker shaded data path) represents a path operating on a lower power supply than the rest of the path, which is the data path.

In some embodiments, latch 200 does not have a local internal clock inverter and hence does not have DC short circuit power or N-well break area overhead. In some embodiments, latch 200 is written through an n-type access device MN1 and hence may not suffer from transmission gate being partially on causing data race/flipping. However, this circuit may suffer from contention between n-type pass gate MN1 and p-type pull-up MP2 during write operation. This contention may worsen under process variation and when the clock path is operating at lower supply than the data path. This contention may result in write failure and may limit the lowest clock voltage at which latch 200 can operate. In some embodiments, contention may be reduced by stacking a p-type device in series with device MP1 and by stacking an n-type device is series with device MN2.

Figure 3:
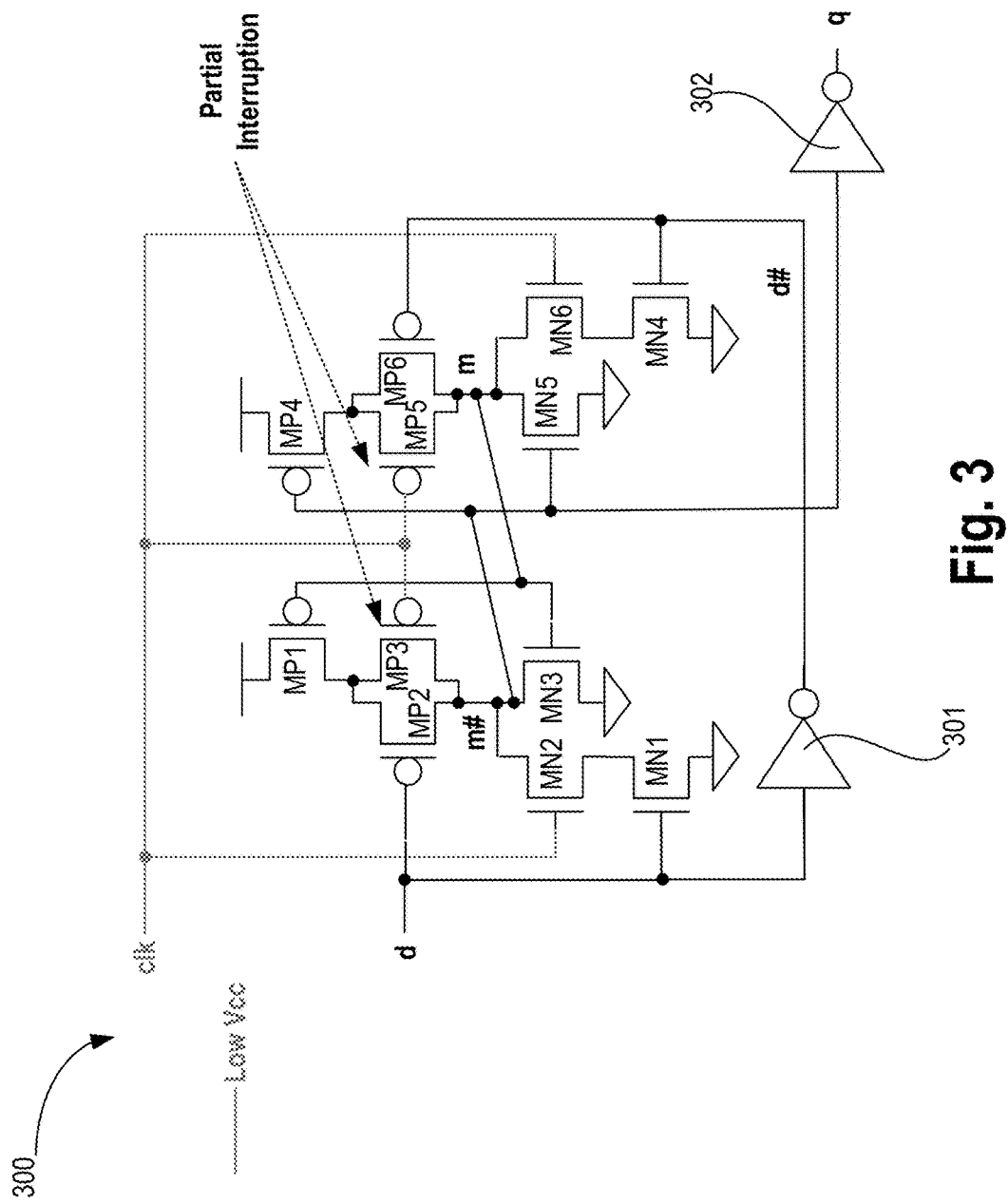
FIG. 3 illustrates a low clock supply voltage interruptible high-phase latch, according to some embodiments of the disclosure.

FIG. 3 illustrates a low clock supply voltage interruptible high-phase latch 300, according to some embodiments of the disclosure. In some embodiments, latch 300 comprises clock node "clk", data node 'd', output node 'q', internal storage nodes 'm' and "m#", n-type devices MN1, MN2, MN3, MN4, MN5, and MN6, p-type devices MP1, MP2, MP3, MP4, MP5, and MP6, and inverters 301 and 302 coupled together as shown. The gray shaded clock path (as opposed to darker shaded data path) represents a path operating on a lower power supply than the data path.

Like latch 200, in some embodiments, latch 300 also does not have a local internal clock inverter and hence does not have DC short circuit power or N-well break area overhead. In some embodiments, the inserted clock controlled p-type devices MP3 and MP5 between cross coupled inverters result in partial interruption reducing the contention during latch write. Here, the cross-coupled inverters without insertion of clock or data controlled devices in them comprise transistors MP1 and MN3 for the first inverter, and transistors MP4 and MN5 for the second inverter. The output "m#" of the first inverter is coupled to the input (e.g., gate terminals of transistors MP4 and MN5) of the second inverter. The output 'm' of the second inverter is coupled to the input (e.g., gate terminals of transistors MP1 and MN3) of the first inverter. As such, first and second inverters together become cross-coupled.

In some embodiments, data controlled p-type devices MP2 and MP6 are inserted in the cross-coupled inverters to help in completing the writing '1' operation to the state nodes "m#" and 'm'. In some embodiments, the reduced contention and write '1' help in lowering clock path power supply voltage under PVT variations with low delay impact. In some embodiments, latch 300 may be used in non-timing critical path.

Figure 4:
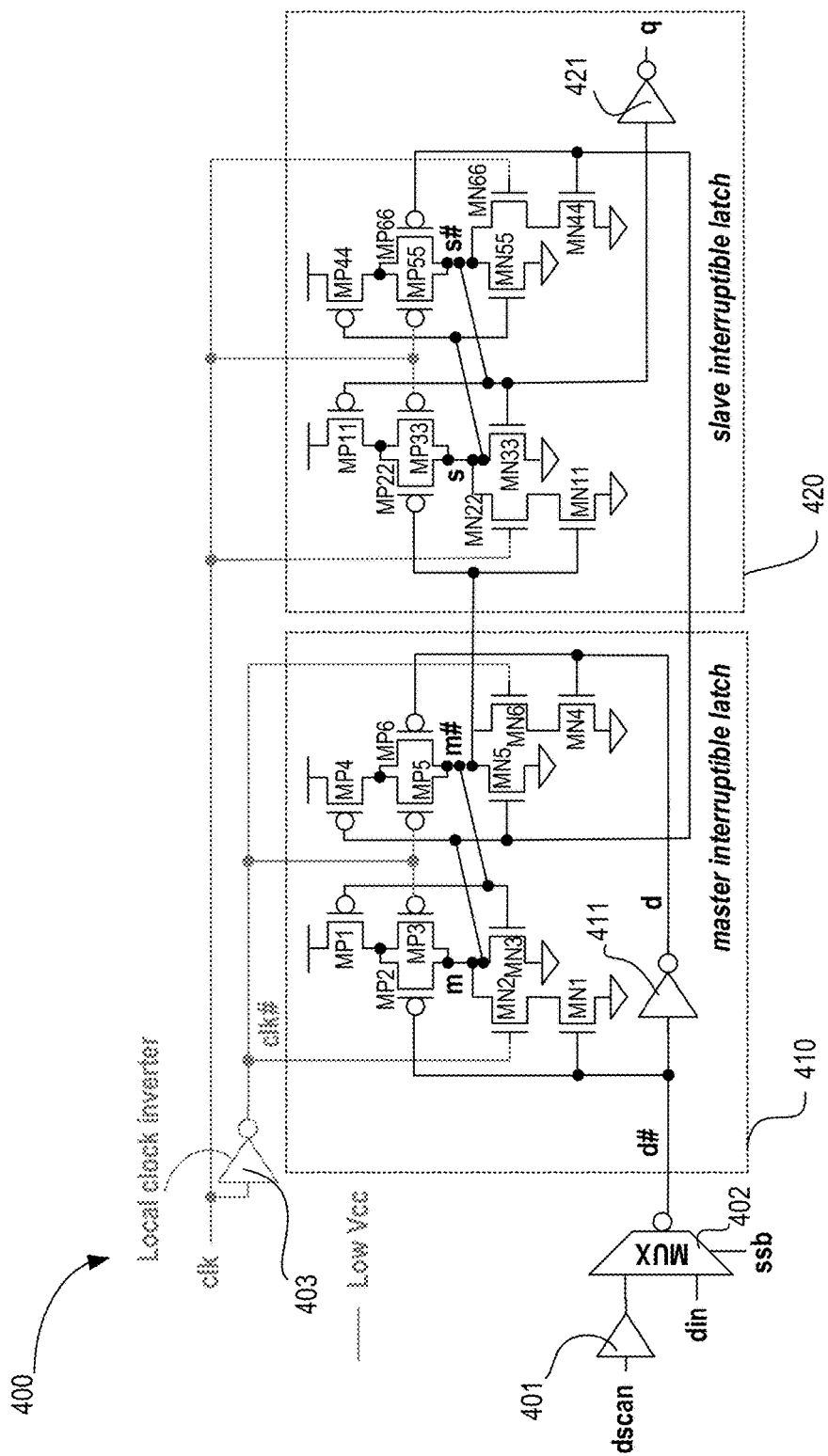
FIG. 4 illustrates a low clock supply voltage interruptible master-slave high-phase FF, according to some embodiments of the disclosure.

FIG. 4 illustrates a low clock supply voltage interruptible master-slave high-phase FF 400, according to some embodiments of the disclosure. In some embodiments, FF 400 comprises scan data buffer 401, scan multiplexer 402, clock inverter 403, high-phase master interruptible latch 410, high-phase slave interruptible latch 420, data scan node "dscan", data input node "din", clock node "clk", output node 'q', internal nodes "clk#", 'd', "d#", "m#", 'm', "s#", and 's' coupled together as shown. Here, "high phase" refers to latching data during the high phase of "clk". For example, during high phase of "clk", the latch is transparent. In some embodiments, the scan multiplexer 402 and associated buffer 401 are removed to form a non-scan enabled FF. For a scan enabled FF, during scan mode, "ssb" may select "dscan" for "d#", while for non-scan mode, "ssb" may select "din" for "d#".

In some embodiments, high-phase master interruptible latch 410 comprises inverter 411, n-type devices MN1, MN2, MN3, MN4, MN5, and MN6; and p-type devices MP1, MP2, MP3, MP4, MP5, and MP6 coupled together as shown. In some embodiments, high-phase slave interruptible latch 420 comprises inverter 421, n-type transistors MN11, MN22, MN33, MN44, MN55, MN66; and p-type devices MP11, MP22, MP33, MP44, MP55, and MP66 coupled together as shown. The gray shaded clock path (as opposed to darker shaded data path) represents a path operating on a lower power supply than the data path.

In some embodiments, FF 400 has a local clock inverter 403 which operates at the lower supply driving a high-phase master interruptible latch 410 followed by high-phase slave interruptible latch 420. In some embodiments, the power supply of the data path is further increased over the lower power supply of the clock path to compensate timing margin due to lower power supply for the clock path.

In some embodiments, "clk" and "clk#" toggle according to the lower power supply. With reference to master interruptible latch 410, in some embodiments, transistors MN2 and MN6 are operable to be fully turned off by "clk#" signal. In some embodiments, transistors MP3 and MP5 of master interruptible latch 410 are partially off by lower power supply based "clk#" signal. As such, contention in master interruptible latch 410 is reduced. With reference to slave interruptible latch 420, in some embodiments, transistors MN22 and MN66 are operable to be fully turned off by "clk" signal. In some embodiments, transistors MP33 and MP55 of slave interruptible latch 420 are partially off by lower power supply based "clk" signal. As such, contention in slave interruptible latch 420 is reduced.

In some embodiments, the N-well of p-type transistors in the clock path (which operates at a lower power supply) is biased by the lower power supply. In some embodiments, the N-well of p-type transistors in the data path (which operates at a higher power supply) is biased by the higher power supply. As such, there is an N-well break between the N-wells of the transistors of the clock and data p-type transistors, in accordance with some embodiments.

Figure 5:
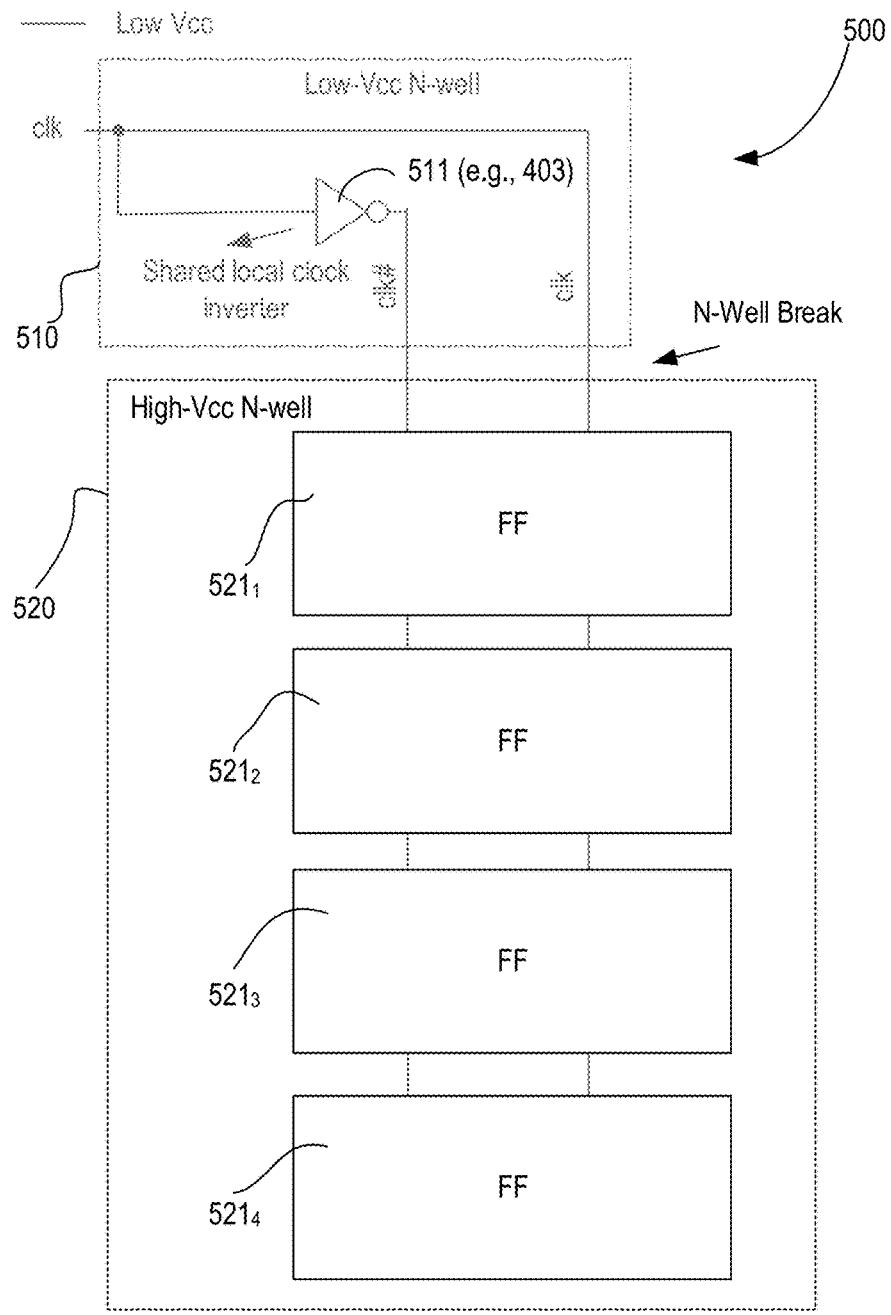
FIG. 5 illustrates a vector interruptible FF with shared lock clock inverter operating on low power supply, according to some embodiments of the disclosure.

FIG. 5 illustrates a vector interruptible FF 500 with shared lock clock inverter operating on a lower power supply, according to some embodiments of the disclosure. It is pointed out that those elements of FIG. 5 having the same reference numbers (or names) as the elements of any other figure can operate or function in any manner similar to that described, but are not limited to such. In some embodiments, FF 500 comprises a low supply N-well region 510 and a high supply N-well region 520. In some embodiments, the area overhead of N-well break between two supplies can be amortized by creating a vectored version of this flop which shares the internal local clock inverter among multiple FFs. In some embodiments, lower power supply biased N-well region 510 (e.g., Low-Vcc N-well) includes a shared clock inverter 511 (e.g., 403) to receive clock "clk" and provide "clk" and inverted version of clock "clk#" to high power supply biased N-well region 520. In some embodiments, high supply N-well region 520 includes a plurality of FFs. Here, four such FFs 521 1-4 are shown as an example. However, any number of FFs can be vectored. In some embodiments, FFs 521 1-4 are scan enabled (e.g., they are operable to receive a data scan input). While the embodiment of FIG. 5 is illustrated with reference to vectorized FFs, latches can also be vectored and can share local clock inverter.

Figure 6:
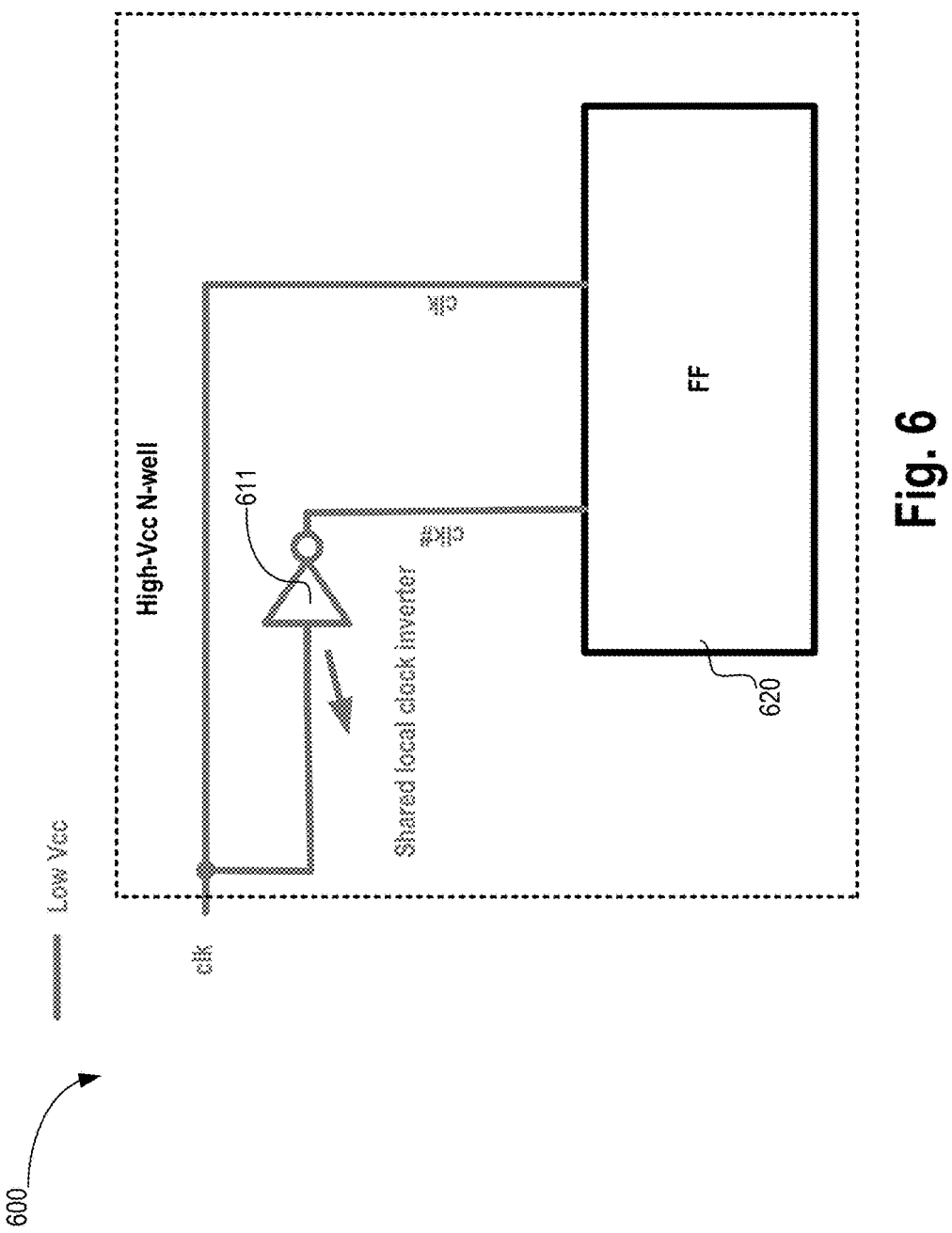
FIG. 6 illustrates a common N-well interruptible FF, according to some embodiments of the disclosure.

FIG. 6 illustrates a common N-well interruptible FF 600, according to some embodiments of the disclosure. It is pointed out that those elements of FIG. 6 having the same reference numbers (or names) as the elements of any other figure can operate or function in any manner similar to that described, but are not limited to such. In some embodiments, a common N-well interruptible flip-flop 620 is provided which connects the N-well of the low supply clock inverter 611 to high supply. In this case, no N-well break is needed at the cost of small increase in junction leakage.

Figure 7:
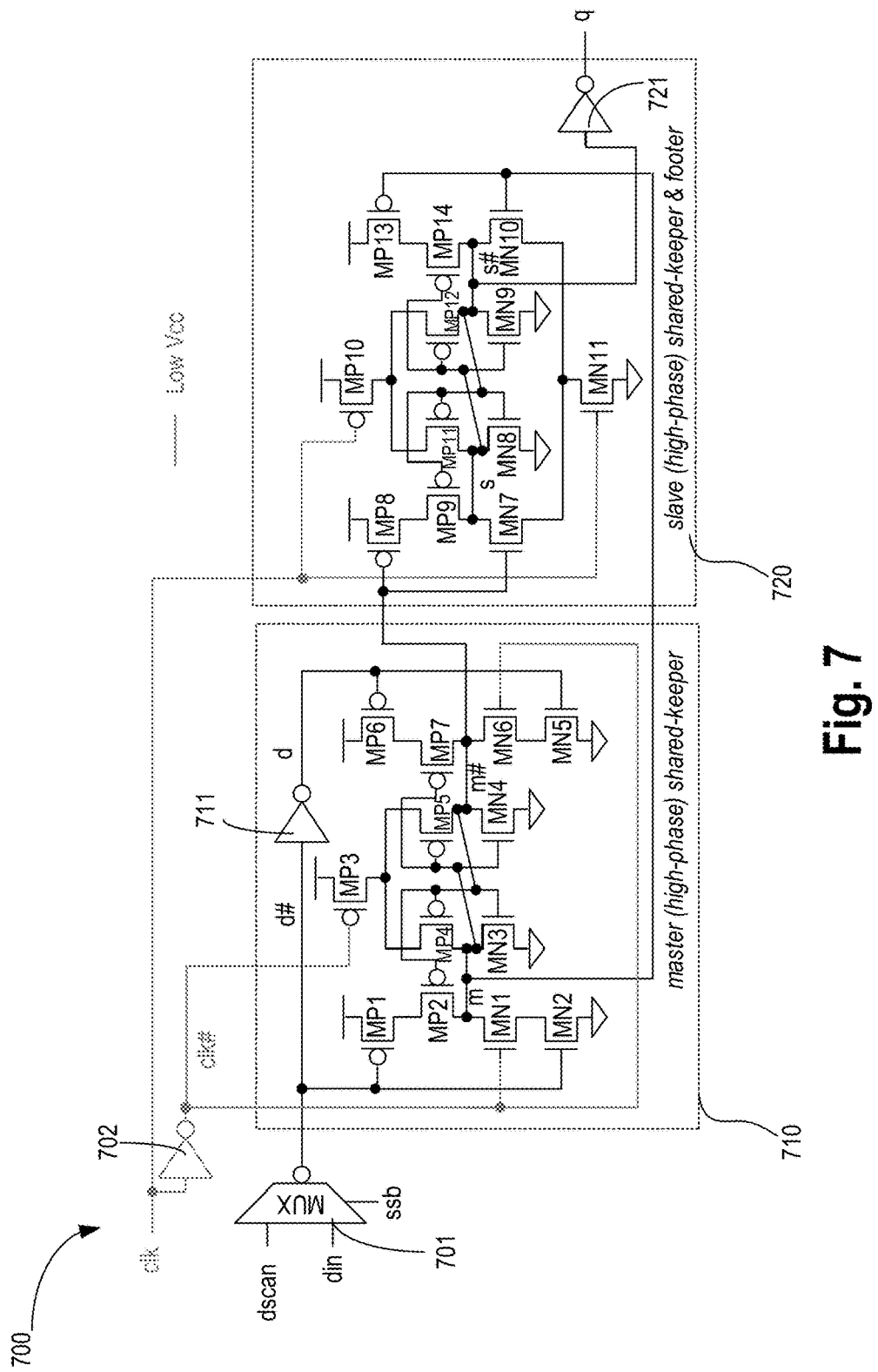
FIG. 7 illustrates a low clock supply voltage shared-keeper master and shared-keeper and footer slave interruptible FF, according to some embodiments of the disclosure.

FIG. 7 illustrates a lower clock supply voltage shared-keeper master and shared-keeper and footer slave interruptible FF 700, according to some embodiments of the disclosure. In some embodiments, FF 700 comprises scan multiplexer 701, clock inverter 702, high-phase master interruptible latch 710, high-phase slave interruptible latch 720, data scan node "dscan", data input node "din", clock node "clk", output node 'q', internal nodes "clk#", "d", "d#", "m#", "s#", and 's' coupled together as shown. Here, "high phase" refers to latching data during the high phase of "clk".

In some embodiments, high-phase master interruptible latch 710 comprises n-type transistors MN1, MN2, MN3, MN4, MN5, and MN6; p-type transistors MP1, MP2, MP3, MP4, MP5, MP6, and MP7, and data inverter 711 coupled together as shown. Here, transistor MP3 is the shared keeper. In some embodiments, high-phase slave interruptible latch 720 comprises n-type transistors MN7, MN8, MN9, MN10, and MN11; p-type transistors MP8, MP9, MP10, MP11, MP12, MP13, and MP14; and output inverter 721 coupled together as shown. Here, transistor MP10 is a shared keeper while transistor MN11 is a shared footer.

In some embodiments, master-slave FF 700 is implemented using 3-clock transistors in the master latch 710: master (N-first) shared keeper MP3, n-type transistor MN1, and n-type transistor MN6. In some embodiments, master-slave FF 700 is implemented using 2-clock transistors in the slave latch 720: slave shared keeper MP10 and shared footer MN11. Including the two transistors of local clock inverter 702, and adding them with the three clock transistors of master latch 710 and the two clock transistors of slave latch 720, the total clock transistors in master-slave FF 700 are seven clock transistors. In comparison, a conventional TG based FF has twelve clock transistors. By reducing the clock transistors from twelve to seven, transistors switching at clock frequency are reduced which in turn reduces power consumption.

FF 700 has fewer clock transistor inside the master slave latch compared to the 8 clock transistors of FF 400 and a local clock inverter. FF 700 further reduces the clock power over clock power of FF 400. Since the number of clock transistors are reduced, FF 700 clock n-type pull-down transistors can be upsized to lower the clock supply voltage further, in accordance with some embodiments. This trades off the increase in clock power due to upsizing with reduced clock power by lowering clock supply.

In some embodiments, shared keeper MP3 provides power supply to cross-coupled inverters comprising transistors MP4, MP5, MN3, and MN4. In some embodiments, shared keeper MP10 provides power supply to cross-coupled inverters comprising transistors MP11, MP12, MN8, and MN9. In some embodiments, shared footer MN11 is formed by eliminating separate n-type transistors which may be coupled in series transistors MN7 and MN10, respectively.

In some embodiments, the local clock inverter 702 between master and slave latches (710 and 720, respectively) changes master latch 710 to be an N-first latch (e.g., a high phase transparent latch), which eliminates high to low switching input condition for slave latch 720 and hence eliminating charge sharing in shared-keeper/footer latch.

Figure 8:
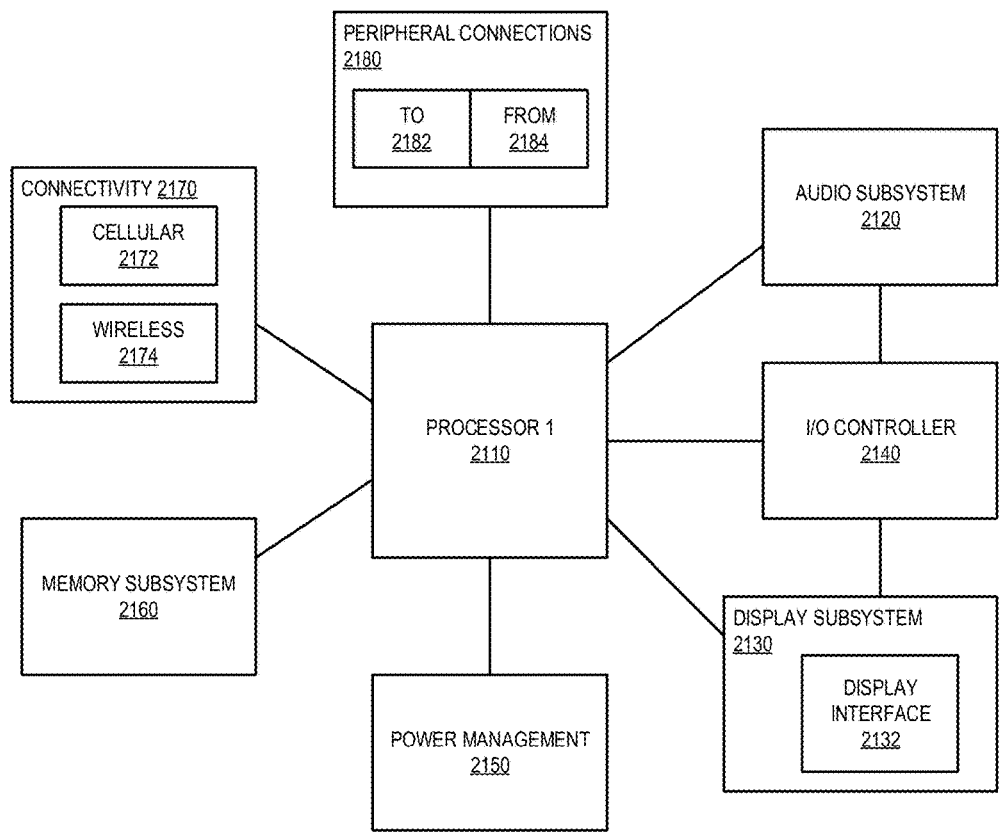
FIG. 8 illustrates a smart device or a computer system or a SoC (System-on-Chip) with low clock supply voltage interruptible FF or latch, in accordance with some embodiments.

FIG. 8 illustrates a smart device or a computer system or a SoC (System-on-Chip) with low clock supply voltage interruptible FF or latch, in accordance with some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with low clock supply voltage interruptible FF or latch, according to some embodiments discussed. Other blocks of the computing device 2100 may also include low clock supply voltage interruptible FF or latch according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a clock node to provide a clock signal generated using a first power supply; a data node to provide a data signal generated using a second power supply, wherein the first power supply has a voltage level which is lower than a voltage level of the second power supply; a data inverter coupled to the data node; a first inverter having a first clock interruptible p-type device coupled to the clock node and a first data input p-type device coupled to the data node; and a second inverter having an output coupled to an input of the first inverter, and an input coupled to an output of the first inverter, wherein the second inverter includes a second clock interruptible p-type device coupled to the clock node and a second data input p-type device coupled to the data inverter.

In some embodiments, the first clock interruptible p-type device is coupled in series with a first p-type device of the first inverter. In some embodiments, the apparatus comprises: a second p-type device coupled in parallel to the first clock interruptible p-type device, wherein the second p-type device has a gate terminal coupled to the data node; and a first clock enabled n-type device coupled in series with the first clock interruptible p-type device and the second p-type device, wherein the first clock enabled n-type device has a gate terminal coupled to the clock node. In some embodiments, the first inverter comprises a third n-type device coupled in series with the first clock interruptible p-type device, wherein a gate terminal of the third n-type device is coupled to an input of the second inverter.

In some embodiments, the apparatus comprises: a first access device having a gate terminal coupled to the data node; and a second access device having a gate terminal coupled to an output of the data inverter. In some embodiments, the second clock interruptible p-type device is coupled in series with a first p-type device of the second inverter. In some embodiments, the apparatus comprises: a sixth p-type device coupled in parallel to the second clock interruptible p-type device, wherein the sixth p-type device has a gate terminal coupled to an output of the data inverter; and a second clock enabled n-type device coupled in series with the second clock interruptible p-type device and the sixth p-type device, wherein the second clock enabled n-type device has a gate terminal coupled to the clock node. In some embodiments, the second inverter comprises a fifth n-type device coupled in series with the second clock interruptible p-type device, wherein a gate terminal of the fifth n-type device is coupled to the output of the first inverter. In some embodiments, the apparatus comprises: an output inverter having an input coupled to the output of the first inverter.

In another example, a system is provided which comprises: a memory; a processor coupled to the memory, the processor having a sequential which comprises an apparatus according to the apparatus described above; and a wireless interface for allowing the processor to communicate with another device.

In another example, an apparatus is provided which comprises: a clock inverter having an input coupled to a clock node, the clock inverter having an output, wherein the clock inverter has an N-well which is coupled to a first power supply; and a plurality of sequential logics coupled to the output of the clock inverter and also coupled to the clock node, wherein at least one sequential logics of the plurality of the sequential logics has an N-well which is coupled to a second power supply, wherein the second power supply has a voltage level lower than a voltage level of the first power supply. In some embodiments, the N-well of the clock inverter is separate from the N-well of the at least one sequential logic. In some embodiments, the sequential logics are one of a latch or a flip-flop. In some embodiments, the latch is an interruptible high-phase latch. In some embodiments, the flip-flop is implemented using interruptible high-phase master and slave latches. In some embodiments, the flip-flop has a master latch with a shared keeper, and wherein the flip-flop has a slave latch with a shared keeper and a shared footer.

In another example, a system is provided which comprises: a memory; a processor coupled to the memory, the processor having a sequential which comprises an apparatus according to the apparatus described above; and a wireless interface for allowing the processor to communicate with another device.

In another example, a method is provided which comprises: providing a clock signal, to a clock node, generated using a first power supply; providing a data signal, to a data node, using a second power supply, wherein the first power supply has a voltage level which is lower than a voltage level of the second power supply; wherein the data node is coupled to a data inverter; wherein the clock node is coupled to a first inverter, having a first clock interruptible p-type device, and a first data input p-type device which is coupled to the data node; and wherein the first inverter has an input coupled to an output of a second inverter, wherein the second inverter has an input coupled to an output of the first inverter, and wherein the second inverter includes a second clock interruptible p-type device coupled to the clock node and a second data input p-type device coupled to the data inverter.

In some embodiments, the first clock interruptible p-type device is coupled in series with a first p-type device of the first inverter. In some embodiments, the first clock interruptible p-type device is coupled in parallel to a second p-type device, wherein the second p-type device has a gate terminal which is coupled to the data node; and wherein a first clock enabled n-type device is coupled in series with the first clock interruptible p-type device and the second p-type device, wherein the first clock enabled n-type device has a gate terminal which is coupled to the clock node.

In some embodiments, wherein the first inverter comprises a third n-type device coupled in series with the first clock interruptible p-type device, wherein a gate terminal of the third n-type device is coupled to an input of the second inverter. In some embodiments, a first access device has a gate terminal which is coupled to the data node; and a second access device has a gate terminal which is coupled to an output of the data inverter. In some embodiments, the second clock interruptible p-type device is coupled in series with a first p-type device of the second inverter. In some embodiments, a sixth p-type device is coupled in parallel to the second clock interruptible p-type device, wherein the sixth p-type device has a gate terminal which is coupled to an output of the data inverter; and a second clock enabled n-type device is coupled in series with the second clock interruptible p-type device and the sixth p-type device, wherein the second clock enabled n-type device has a gate terminal which is coupled to the clock node.

In some embodiments, the second inverter comprises a fifth n-type device which is coupled in series with the second clock interruptible p-type device, wherein a gate terminal of the fifth n-type device is coupled to the output of the first inverter. In some embodiments, an output inverter has an input coupled to the output of the first inverter.

In another example, an apparatus is provided to perform the method described above.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first latch including:
      a first clock node to provide a first clock signal generated with a device coupled to a first power supply node;
      a data node to provide a data signal generated with a device coupled to a second power supply node, wherein the first power supply node has a voltage level which is lower than a voltage level of the second power supply node;
      a data inverter coupled to the data node;
      a first circuitry having:
         a first clock interruptible n-type device coupled to the first clock node; and
         a first data input n-type device coupled to the data node, wherein the first clock interruptible n-type device is coupled in series with the first data input n-type device; and
      a second circuitry having an output coupled to an input of the first circuitry, and an input coupled to an output of the first circuitry, wherein the second circuitry includes:
         a first clock interruptible n-type device coupled to the first clock node; and
         a first data input n-type device coupled to the output of the data inverter; and
   a second latch coupled in series with the first latch, wherein the second latch is a slave latch and the first latch is a master latch, wherein the second latch including:
      a second clock node to provide a second clock signal, wherein the second clock signal is an inverse of the first clock signal, wherein the second clock signal is generated by a second device coupled to the first power supply node;
      a data node coupled to an output of the second circuitry of the first latch;
      a first circuitry having:
         a first clock interruptible n-type device coupled to the second clock node; and
         a first data input n-type device coupled to output of the second circuitry of the first latch, wherein the first clock interruptible n-type device is coupled in series with the first data input n-type device; and
      a second circuitry having an output coupled to an input of the first circuitry of the second latch, and an input coupled to an output of the first circuitry of the second latch, wherein the second circuitry of the second latch includes:
         a first clock interruptible n-type device coupled to the second clock node; and
         a first data input n-type device coupled to an output of the first circuitry of the first latch.

2. The apparatus of claim 1, wherein the first clock interruptible n-type device of the first circuitry of the first latch is coupled in series with a first p-type device of the first circuitry of the first latch.

3. The apparatus of claim 2, wherein the first circuitry of the first latch comprises:
   a first clock interruptible p-type device coupled in parallel to the first p-type device of the first circuitry, wherein the first clock interruptible p-type device has a gate terminal coupled to the clock node; and a second p-type device coupled in series with the first clock interruptible p-type device and a first n-type device.

4. The apparatus of claim 3, wherein a gate terminal of the first n-type device of the first latch is coupled to the output of the second circuitry of the first latch.

5. The apparatus of claim 1 comprises:
a multiplexer coupled to the data node and an input of the data inverter of the first latch.

6. The apparatus of claim 1, wherein the first clock interruptible n-type device of the second circuitry of the first latch is coupled in series with a second clock interruptible p-type device of the second circuitry of the first latch.

7. The apparatus of claim 6, wherein the
second clock interruptible p-type device of the second circuitry of the first latch is coupled in parallel to a third p-type device of the first latch, wherein the third p-type device has a gate terminal coupled to an output of the data inverter; and wherein the second circuitry of the first latch comprises:
a third n-type device of the first latch coupled in series with the second clock interruptible p-type device of the first latch, wherein a gate terminal of the third n-type device is coupled to an output of the first circuitry of the first latch.

8. The apparatus of claim 7, wherein the second circuitry of the first latch comprises a fourth p-type device coupled in series with the second clock interruptible p-type device of the second circuitry of the first latch, and wherein the fourth p-type device has a gate terminal coupled to the output of the first circuitry of the first latch.

9. The apparatus of claim 1 comprises an output inverter having an input coupled to the output of the first circuitry of the second latch.

10. An apparatus comprising:
a first clock node to provide a first clock signal generated with a device coupled to a first power supply node;
a second clock node to provide an inverse of the first clock signal, wherein the second clock node is generated by an inverter powered by the first power supply node;
a multiplexer to selectively provide one of a data or scan input to a data node;
a first latch coupled to the second clock node and the data node;
a second latch coupled to an output of the first latch, wherein the second latch is coupled to the first clock node, wherein the first and second latches and the multiplexer are coupled to a second power supply node, and wherein the first power supply node has a voltage level which is lower than a voltage level of the second power supply node.

11. The apparatus of claim 10, wherein the first latch is a master latch which comprises a shared keeper.

12. The apparatus of claim 11, wherein the second latch is a slave latch which comprises a shared keeper and a shared footer.

13. The apparatus of claim 11, wherein the shared keeper of the first latch is coupled to the second clock node.

14. The apparatus of claim 12, wherein the shared keeper and shared footer of the second latch are coupled to the first clock node.

* * * * *